United States Patent
Lee et al.

(10) Patent No.: US 8,456,943 B2
(45) Date of Patent: Jun. 4, 2013

(54) ELECTRONIC DEVICE AND METHOD FOR PREVENTING DATA LOSS IN MEMORY STORAGE DEVICE AND ELECTRONIC DEVICE ASSEMBLY

(75) Inventors: Te-Hua Lee, Taipei Hsien (TW); Che Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 225 days.

(21) Appl. No.: 12/820,318

(22) Filed: Jun. 22, 2010

(65) Prior Publication Data

US 2011/0069575 A1    Mar. 24, 2011

(30) Foreign Application Priority Data

Sep. 18, 2009   (CN) .......................... 2009 1 0307330

(51) Int. Cl.
*G11C 5/14* (2006.01)
(52) U.S. Cl.
USPC ....................................... 365/229

(58) Field of Classification Search
USPC ....................................... 365/229
See application file for complete search history.

(56) References Cited

U.S. PATENT DOCUMENTS

| | | | | |
|---|---|---|---|---|
| 4,422,163 | A * | 12/1983 | Oldenkamp | 365/229 |
| 5,264,732 | A * | 11/1993 | Fiorina et al. | 307/66 |
| 6,816,428 | B2 * | 11/2004 | Zimmermann et al. | 365/226 |
| 7,177,979 | B2 | 2/2007 | Kuwamura | |
| 2008/0291754 | A1 * | 11/2008 | Nakai et al. | 365/189.14 |

FOREIGN PATENT DOCUMENTS

CN    2590241 Y    12/2003

\* cited by examiner

*Primary Examiner* — Hoai V Ho
*Assistant Examiner* — Tri Hoang
(74) *Attorney, Agent, or Firm* — Altis Law Group, Inc.

(57) ABSTRACT

An electronic device includes a memory storage device, a storing unit, and a voltage increasing unit. The storing unit is used for receiving the supply voltage to store energy and releasing energy to generate an standby voltage when the power supply stops providing the supply voltage. The voltage increasing unit is used for receiving the standby voltage, increasing the standby voltage, and providing the increased standby voltage to the memory storage device for preventing data loss in the memory storage device. A related method for preventing data loss in a memory storage device and an electronic device assembly are also provided.

13 Claims, 3 Drawing Sheets

ELECTRONIC DEVICE AND METHOD FOR PREVENTING DATA LOSS IN MEMORY STORAGE DEVICE AND ELECTRONIC DEVICE ASSEMBLY

BACKGROUND

1. Technical Field

The disclosed embodiments relate to memories, and more particularly to preventing data loss in a memory storage device.

2. Description of Related Art

Commonly, an electronic device is used for receiving a supply voltage from a power supply and being powered on. The electronic device includes a memory storage device for storing data.

However, when the power supply is suddenly interrupted, the memory storage device cannot store data in time and the data may be lost.

What is needed, therefore, is an electronic device and a method for preventing data loss in a memory storage device and an electronic device assembly to overcome the above described limitations.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
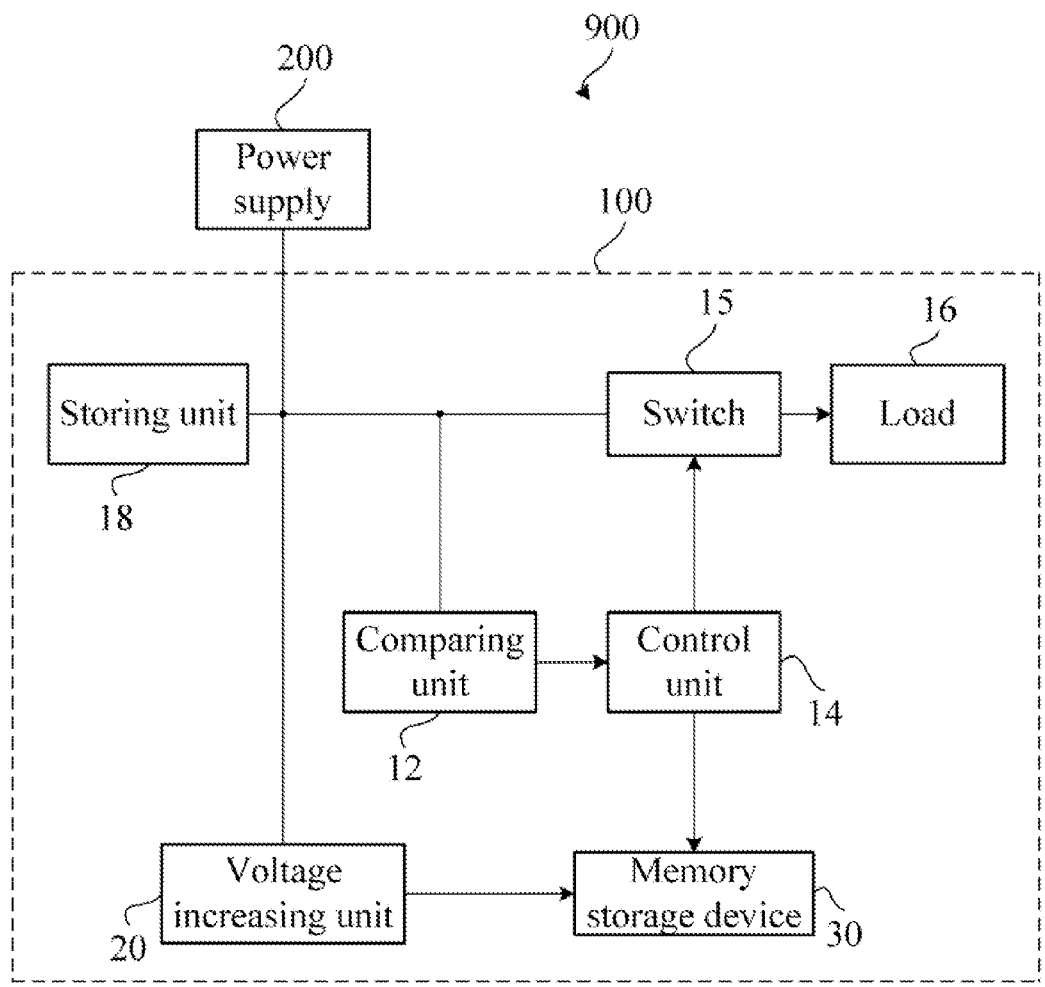
FIG. 1 is a block diagram of an electronic device assembly in accordance with an exemplary embodiment.

Referring to FIG. 1, an electronic device assembly 900 includes an electronic device 100 and a power supply 200. The electronic device 100 is used for receiving a supply voltage from the power supply 200 and being powered on. The electronic device 100 includes a comparing unit 12, a control unit 14, a switch 15, a load 16, a storing unit 18, a voltage increasing unit 20, and a memory storage device 30. The switch 15 is electrically connected between the power supply 200 and the load 16. The load 16 receives the supply voltage through the switch 15 and is activated.

The comparing unit 12 presets a first reference voltage. The comparing unit 12 is used for receiving the supply voltage from the power supply 200, comparing the supply voltage with the first reference voltage, and generating a first control signal if the supply voltage is smaller than the first reference voltage.

The control unit 14 is also used for turning off the switch 15 according to the first control signal, the supply voltage cannot be transmitted to the load 16 through the switch 15, the load 16 stops working, thus electric energy is saved.

The storing unit 18 is used for receiving the supply voltage to store energy, and releasing energy to generate an standby voltage when the power supply 200 stop providing the supply voltage.

The voltage increasing unit 20 is used for receiving the supply voltage, increasing the supply voltage, and providing the increased supply voltage to the memory storage device 30. The voltage increasing unit 20 is also used for receiving the standby voltage when the power supply 200 stops providing the supply voltage, increasing the standby voltage, and providing the increased standby voltage to the memory storage device 30. Therefore, although the power supply 200 stops providing the supply voltage, the memory storage device 30 still can receive the increased standby voltage and stores the data in time.

The comparing unit 12 further presets a second reference voltage. The comparing unit 12 is used for comparing the standby voltage with the second reference voltage and generating a second control signal if the standby voltage is smaller than the second reference voltage. The control unit 14 disables the memory storage device 30 according to the second control signal.

Figure 2:
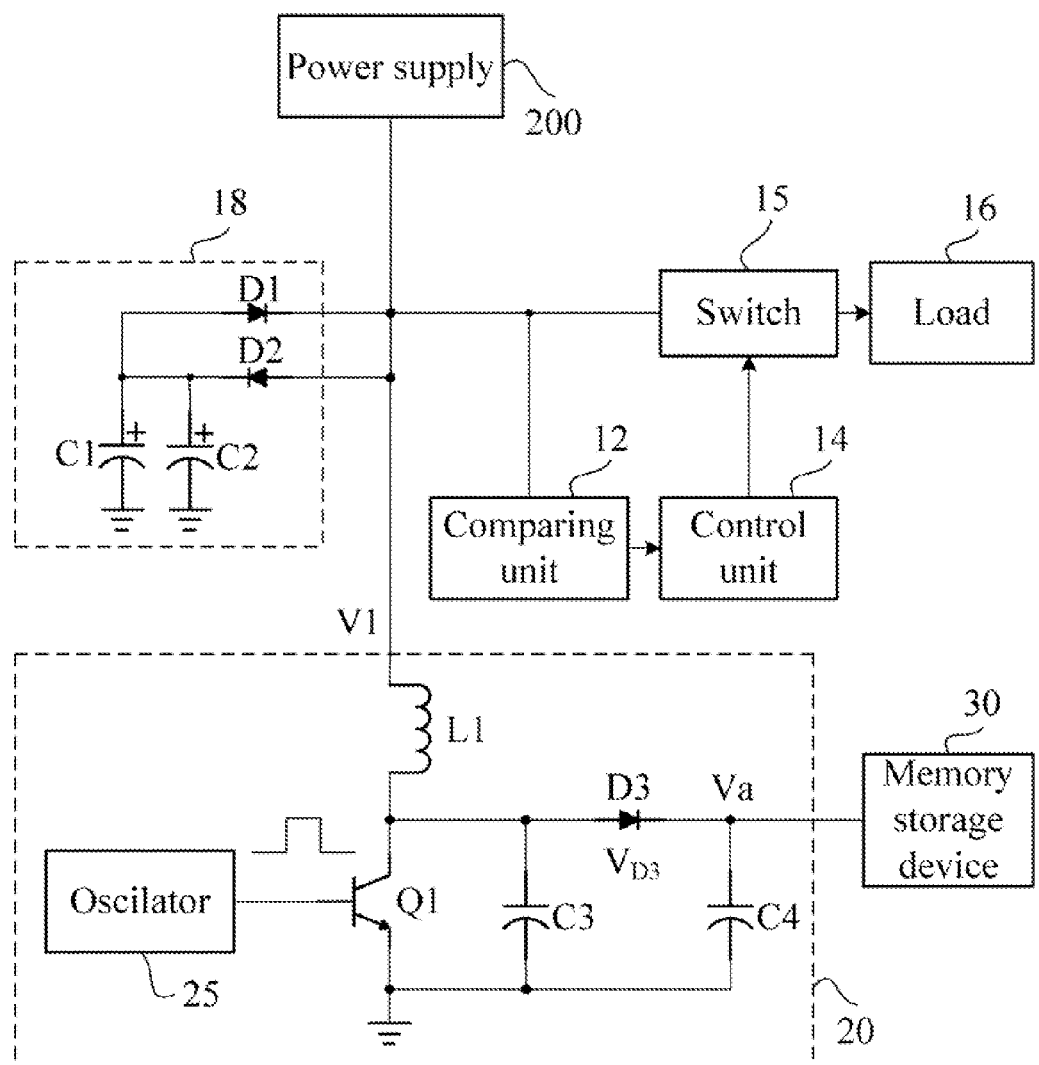
FIG. 2 is a circuit diagram of the electronic device assembly of FIG. 1 in accordance with the exemplary embodiment.

Referring to FIG. 2, the storing unit 18 includes a first diode D1, a second diode D2, a first capacitor C1, and a second capacitor C2. A cathode of the first diode D1 connects the power supply 200 and the comparing unit 12, an anode of the first diode D1 connects a cathode of the second diode D2. An anode of the second diode D2 connects the cathode of the first diode D1. The first capacitor C1 and the second capacitor C2 are connected in parallel between the anode of the first diode D1 and ground.

The voltage increasing unit 20 includes an oscillator 25, a transistor Q1, an inductor L1, a third diode D3, a third capacitor C3, and a fourth capacitor C4. A base of the transistor Q1 connects the oscillator 25, an emitter of the transistor Q1 is grounded. One end of the inductor L1 connects the power supply 200, the other end of the inductor L1 connects a collector of the transistor Q1. One end of the third capacitor C3 connects the collector of the transistor Q1, the other end of the third capacitor C3 is grounded. An anode of the third diode D3 connects the collector of the transistor Q1, a cathode of the third diode D3 connects the memory storage device 30. One end of the fourth capacitor C4 connects between the cathode of the third diode D3 and the memory storage device 30, the other end of the fourth capacitor C4 is grounded. In this embodiment, the transistor Q1 is an NPN type transistor.

The principle of the electronic device assembly 900 is illustrated as follows: when the electronic device assembly 900 is powered on, the supply voltage from the power supply 200 charges the first capacitor C1 and the second capacitor C2 through the second diode D2, the first capacitor C1 and the second capacitor C2 stores energy accordingly.

When the power supply 200 stops providing the supply voltage, the first capacitor C1 and the second capacitor C2 discharges to generate the standby voltage V1. The oscillator 25 provides a pulse voltage, when the pulse voltage is a high level voltage, the transistor Q1 is turned off, and the inductor L1 stores energy. When the pulse voltage is a low level voltage, the transistor Q1 is turned off, the inductor L1 release energy so the voltage $Va=2V1-V_{D3}$, $V_{D3}$ is a voltage across the third diode D3 when the third diode D3 conducts. Therefore the voltage Va is enough to power the memory storage device 30. Although the power supply 200 stops providing the supply voltage, the memory storage device 30 can still be powered on and has enough time to store the data preventing data loss.

Figure 3:
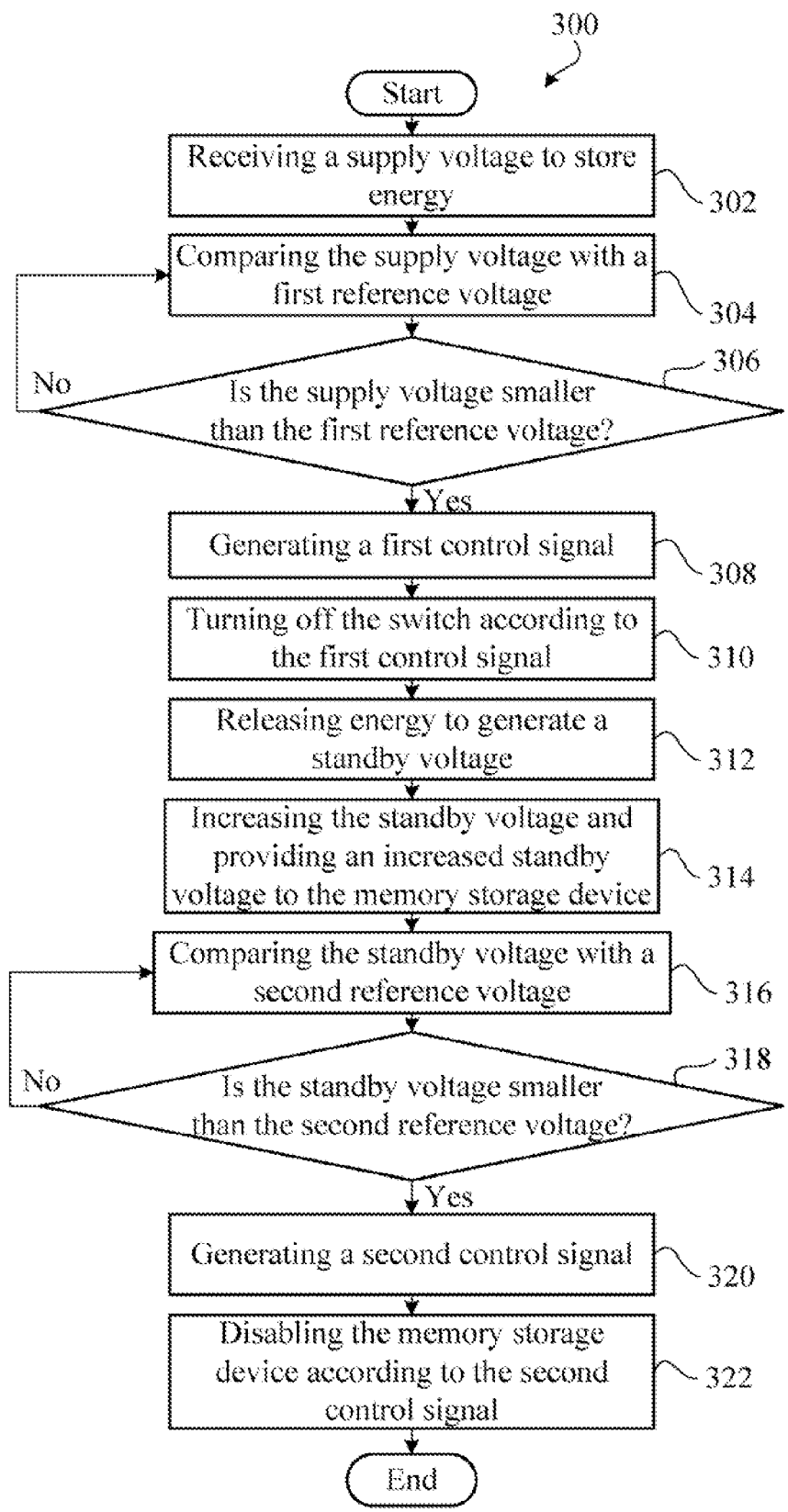
FIG. 3 illustrates a method for preventing data loss in a memory storage device in accordance with the exemplary embodiment.

Referring to FIG. 3, a method 300 is illustrated for preventing data loss in the memory storage device 30, the method 300 comprises following steps:

Step 302, provides a switch 15 electrically connected between a power supply 200 and a load 16, the load 16 receives a supply voltage from the power supply 200 through the switch 15 and is activated; and receiving the supply voltage to store energy;

Step 304, compares the supply voltage with a first reference voltage;

Step 306, determines whether the supply voltage is smaller than the first reference voltage; if the supply voltage is larger than or equal to the first reference voltage, the procedure goes to Step 304; if the supply voltage is smaller than the first reference voltage, the procedure goes to Step 308;

Step 308, generates a first control signal;

Step 310, turns off the switch 15 according to the first control signal, thus the load 16 cannot receive the supply voltage and stops working, and electric energy is saved;

Step 312, releases energy to generate an standby voltage when the power supply 200 stops providing the supply voltage;

Step 314, increases the standby voltage and provides an increased standby voltage to the memory storage device 30 for storing the data;

Step 316, compares the standby voltage with a second reference voltage;

Step 318, determines whether the standby voltage is smaller than the second reference voltage; if the standby voltage is larger than or equal to the second reference voltage, the procedure goes to Step 316; if the standby voltage is smaller than the second reference voltage, the procedure goes to Step 320;

Step 320, generates a second control signal;

Step 322, disables the memory storage device 30 according to the second control signal.

Alternative embodiments will become apparent to those skilled in the art without departing from the spirit and scope of what is claimed. Accordingly, the present invention should be deemed not to be limited to the above detailed description, but rather only by the claims that follow and equivalents thereof.

What is claimed is:

1. An electronic device being powered on when received a supply voltage from a power supply, the electronic device comprising:
    a memory storage device for storing data;
    a storing unit for receiving the supply voltage to store energy and releasing energy to generate a standby voltage when the power supply stops providing the supply voltage; and
    a voltage increasing unit for receiving the standby voltage, increasing the standby voltage, and providing the increased standby voltage to the memory storage device for preventing data loss in the memory storage device;
    wherein the storing unit comprises a first diode, a second diode, and a first capacitor; a cathode of the first diode is connected to the power supply and the comparing unit, an anode of the first diode is connected to a cathode of the second diode, an anode of the second diode is connected to the cathode of the first diode, an anode of the first capacitor is connected to the anode of the first diode, a cathode of the first capacitor is grounded.

2. The electronic device of claim 1, wherein the electronic device comprises a comparing unit, a control unit, a switch and a load; the switch is connected between the power supply and the load, the load receives the supply voltage through the switch and starts to work, the comparing unit is connected to the power supply and presets a first reference voltage, the comparing unit is used for comparing the supply voltage with the first reference voltage and generating a first control signal if the supply voltage is smaller than the first reference voltage, the control unit is used for turning off the switch according to the first control signal, and the supply voltage cannot be transmitted to the load through the switch.

3. The electronic device of claim 1, wherein the electronic device further comprises a comparing unit and a control unit; the comparing unit presets a second reference voltage; the comparing unit compares the standby voltage with the second reference voltage, and generates a second control signal if the standby voltage is smaller than the second reference voltage; and the control unit disables the memory storage device according to the second control signal.

4. The electronic device of claim 1, wherein the voltage increasing unit comprises an oscillator for providing a pulse voltage, a transistor, an inductor, a third diode, and a third capacitor; a base of the transistor is connected to the oscillator, an emitter of the transistor is grounded; one end of the inductor is connected to the power supply, the other end of the inductor is connected to a collector of the transistor; an anode of the third diode is connected to the collector of the transistor, a cathode of the third diode is connected to the memory storage device; one end of the third capacitor is connected between the cathode of the third diode and the memory storage device, the other end of the third capacitor is grounded; wherein when the pulse voltage is a high level voltage, the transistor is turned on, and when the pulse voltage is a low level voltage, the transistor is turned off.

5. The electronic device of claim 4, wherein the voltage increasing unit further comprises a fourth capacitor; one end of the fourth capacitor is connected between the collector of the transistor and the anode of the third diode, and the other end of the fourth capacitor is grounded, wherein the transistor is a NPN type transistor.

6. The electronic device of claim 1, wherein the storing unit further comprises a second capacitor, an anode of the second capacitor is connected to the anode of the first diode, a cathode of the second capacitor is grounded.

7. An electronic device assembly comprising:
    a power supply for providing a supply voltage;
    an electronic device being powered on when received the supply voltage; the electronic device comprising:
    a memory storage device for storing data;
    a storing unit for receiving the supply voltage to store energy and releasing energy to generate a standby voltage when the power supply stops providing the supply voltage; and
    a voltage increasing unit for receiving the standby voltage, increasing the standby voltage, and providing the increased standby voltage to the memory storage device for preventing data loss in the memory storage device;
    wherein the voltage increasing unit comprises an oscillator for providing a pulse voltage, a transistor, an inductor, a third diode, and a third capacitor; a base of the transistor is connected to the oscillator, an emitter of the transistor is grounded; one end of the inductor is connected to the power supply, the other end of the inductor is connected to a collector of the transistor; an anode of the third diode is connected to the collector of the transistor, a cathode of the third diode is connected to the memory storage device; one end of the third capacitor is connected between the cathode of the third diode and the memory storage device, the other end of the third capacitor is grounded; wherein when the pulse voltage is a high level voltage, the transistor is turned on, and when the pulse voltage is a low level voltage, the transistor is turned off.

8. The electronic device assembly of claim 7, wherein the electronic device comprises a comparing unit, a control unit, a switch and a load; the switch is connected between the power supply and the load, the load receives the supply voltage through the switch and starts to work, the comparing unit is connected to the power supply and presets a first reference voltage, the comparing unit is used for comparing the supply voltage with the first reference voltage and generating a first control signal if the supply voltage is smaller than the first reference voltage, the control unit is used for turning off the switch according to the first control signal, and the supply voltage cannot be transmitted to the load through the switch.

9. The electronic device assembly of claim 7, wherein the electronic device further comprises a comparing unit and a control unit; the comparing unit presets a second reference voltage; the comparing unit compares the standby voltage with the second reference voltage, and generates a second control signal if the standby voltage is smaller than the second reference voltage; and the control unit disables the memory storage device according to the second control signal.

10. The electronic device assembly of claim 7, wherein the voltage increasing unit further comprises a fourth capacitor; one end of the fourth capacitor is connected between the collector of the transistor and the anode of the third diode, and the other end of the fourth capacitor is grounded, wherein the transistor is a NPN type transistor.

11. The electronic device assembly of claim 7, wherein the storing unit comprises a first diode, a second diode, and a first capacitor; a cathode of the first diode is connected to the power supply and the comparing unit, an anode of the first diode is connected to a cathode of the second diode, an anode of the second diode is connected to the cathode of the first diode, an anode of the first capacitor is connected to the anode of the first diode, a cathode of the first capacitor is grounded.

12. The electronic device assembly of claim 11, wherein the storing unit further comprises a second capacitor, an anode of the second capacitor is connected to the anode of the first diode, a cathode of the second capacitor is grounded.

13. The electronic device assembly of claim 7, wherein the transistor is a NPN type transistor.

* * * * *